United States Patent
Inomata

(10) Patent No.: US 8,698,141 B2
(45) Date of Patent: Apr. 15, 2014

(54) SOLID STATE IMAGE PICKUP DEVICE AND MANUFACTURING METHOD OF SOLID STATE IMAGE PICKUP DEVICE, AND IMAGE PICKUP APPARATUS

(75) Inventor: Hiroshi Inomata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 10 days.

(21) Appl. No.: 13/635,544

(22) PCT Filed: Mar. 15, 2011

(86) PCT No.: PCT/JP2011/056088
§ 371 (c)(1),
(2), (4) Date: Sep. 17, 2012

(87) PCT Pub. No.: WO2011/115126
PCT Pub. Date: Sep. 22, 2011

(65) Prior Publication Data
US 2013/0009044 A1   Jan. 10, 2013

(30) Foreign Application Priority Data

Mar. 17, 2010  (JP) ................................. 2010-061622
Jan. 11, 2011  (JP) ................................. 2011-003499

(51) Int. Cl.
*H01L 23/58* (2006.01)
*H01L 29/41* (2006.01)
*H01L 23/532* (2006.01)

(52) U.S. Cl.
USPC .................. 257/48; 257/448; 438/18; 438/66

(58) Field of Classification Search
USPC ................................. 257/48, 448; 438/18, 66
See application file for complete search history.

(56) References Cited

U.S. PATENT DOCUMENTS 5,483,155 A * 1/1996 Kannegundla et al. .. 324/762.02
6,330,354 B1 * 12/2001 Companion et al. .......... 382/150

FOREIGN PATENT DOCUMENTS

| JP | 633454 A | 1/1988 |
|---|---|---|
| JP | 2000332228 A | 11/2000 |
| JP | 200290422 A | 3/2002 |
| JP | 2004296464 A | 10/2004 |
| JP | 3908908 B2 | 1/2007 |
| JP | 200847667 A | 2/2008 |

OTHER PUBLICATIONS

International Search Report dated Apr. 12, 2011 from the International Searching Authority in counterpart application No. PCT/JP2011/056088.
Written Opinion dated Apr. 12, 2011 from the International Searching Authority in counterpart application No. PCT/JP2011/056088.

* cited by examiner

*Primary Examiner* — Evan Pert
(74) *Attorney, Agent, or Firm* — Sughrue Mion, PLLC

(57) ABSTRACT

A solid-state image pickup device includes a plurality of photoelectric conversion units, a plurality of signal read-out circuits, and a test terminal for testing the photoelectric conversion units. Each of the photoelectric conversion units includes a pixel electrode film, an opposing electrode film opposing the pixel electrode film and a light receiving layer disposed between the pixel electrode film and the opposing electrode film. The photoelectric conversion units are arranged in a two-dimensional array above a semiconductor substrate. Each of the signal read-out circuits are configured to read out a signal corresponding to an amount of electrical charges generated in the light receiving layer and transferred to the pixel electrode film. The test terminal is disposed outside of an area where the photoelectric conversion units are disposed, disposed on the same plane as the pixel electrode film, and made of the same material as the pixel electrode film.

13 Claims, 8 Drawing Sheets

SOLID STATE IMAGE PICKUP DEVICE AND MANUFACTURING METHOD OF SOLID STATE IMAGE PICKUP DEVICE, AND IMAGE PICKUP APPARATUS

TECHNICAL FIELD

The present invention relates to a solid-state image pickup device, a manufacturing method of the solid-state image pickup device, and an image pickup apparatus.

BACKGROUND OF THE INVENTION

When manufacturing a semiconductor integrated circuit (IC), it is hard to know whether the semiconductor IC is a good product or a defective product without testing and evaluating the semiconductor IC. For this reason, a test is made by contacting a probe to a connection pad for test or a connection pad actually used after the semiconductor IC is manufactured, as described in Patent Document 1.

However, the connection pad is laminated with insulation layers and the like as the semiconductor IC manufacturing processes are progressed. Accordingly, when performing a test, the connection pad itself needs to be exposed by, for example, etching the insulation layer or the like.

That is, there is a problem in the configuration of the semiconductor IC in the related art in that the testing is not able to be performed before reaching a final stage of the semiconductor IC manufacturing, and even a defective semiconductor IC needs to be subject to the semiconductor IC manufacturing until reaching the final stage thereof.

If an evaluation test for a good product or a defective product can be performed during the manufacturing process of the semiconductor IC without having the connection pad to be opened and exposed, the remaining process may be skipped for the defective product and the throughput can be increased while reducing the cost.

Therefore, in the related art, a test pad is formed to be parallel with a connection pad to be connected by wires, so that an evaluation test can be conducted with the test pad even without using the connection pad, as described in Patent Documents 2 and 3.

PRIOR ART DOCUMENT

Patent Literature

[Patent Document 1] Japanese Patent No. 3908908
[Patent Document 2] JP-A-2004-296464
[Patent Document 3] JP-A-2002-090422

SUMMARY OF THE INVENTION

Problems to be Solved

However, in the conventional test pad, a process of manufacturing the test pad needs to be added in the semiconductor IC manufacturing process, so that the number of manufacturing processes and the cost for product are increased.

Further, for instance, when an image pickup device is manufactured using a soft material such as an organic material, a processing for manufacturing the test pad or the like is required to be added such that a performance of an organic material film formed previously is not degraded, and as a result, there is concern that manufacturing cost may be increased.

The present invention is intended to provide a solid-state image pickup device having a structure capable of being tested even during manufacturing without requiring a separate manufacturing process for the test terminal, a manufacturing method of the solid-state image pickup device, and an image pickup apparatus equipped with the solid-state image pickup device.

Means for Solving Problem

A solid-state image pickup device according to an exemplary embodiment of the present invention includes a plurality of photoelectric conversion units arranged in a two-dimensional array on an upper surface of a semiconductor substrate. Each of the plurality of photoelectric conversion units include a pixel electrode film, an opposing electrode film opposing the pixel electrode film and a light receiving layer sandwiched between the pixel electrode film and the opposing electrode film. The solid-state image pickup device includes a plurality of signal read-out circuits each configured to read out a signal corresponding to amounts of electrical charges generated in the light receiving layer and transferred to the pixel electrode film and a plurality of test terminals disposed outside of an area where the photoelectric conversion units are disposed to test the photoelectric conversion units. The test terminals are disposed on the same surface and made of the same material as the pixel electrode film.

A manufacturing method of the solid-state image pickup device according to an exemplary embodiment of the present invention, in which the photoelectric conversion units of the solid-state image pickup device each including a pixel electrode film, an opposing electrode film opposing the pixel electrode film, a light receiving layer sandwiched between the pixel electrode film and the opposing electrode are arranged in a two-dimensional array on an upper surface of a semiconductor substrate, includes depositing and patterning a conductive material on an upper surface of the semiconductor substrate in which a plurality of signal read-out circuits each reading out a signal corresponding to amounts of electrical charges generated in the light receiving layer and transferred to the pixel electrode film are formed, and forming both the pixel electrode film and the test terminal simultaneously for testing the photoelectric conversion units.

An image pickup apparatus according to an exemplary embodiment of the present invention includes the solid-state image pickup device.

Effect of Invention

According to the present invention, it is possible to provide a solid-state image pickup device capable of testing the semiconductor IC product even during manufacturing of the product without requiring a separate process for manufacturing the test terminal, a manufacturing method for the solid-state image pickup device, and an image pickup apparatus equipped with the solid-state image pickup device.

DESCRIPTION OF THE PREFERRED EMBODIMENTS OF THE INVENTION

Hereinafter, an exemplary embodiment of the present invention will be described with reference to the accompanying drawings.

Figure 1:
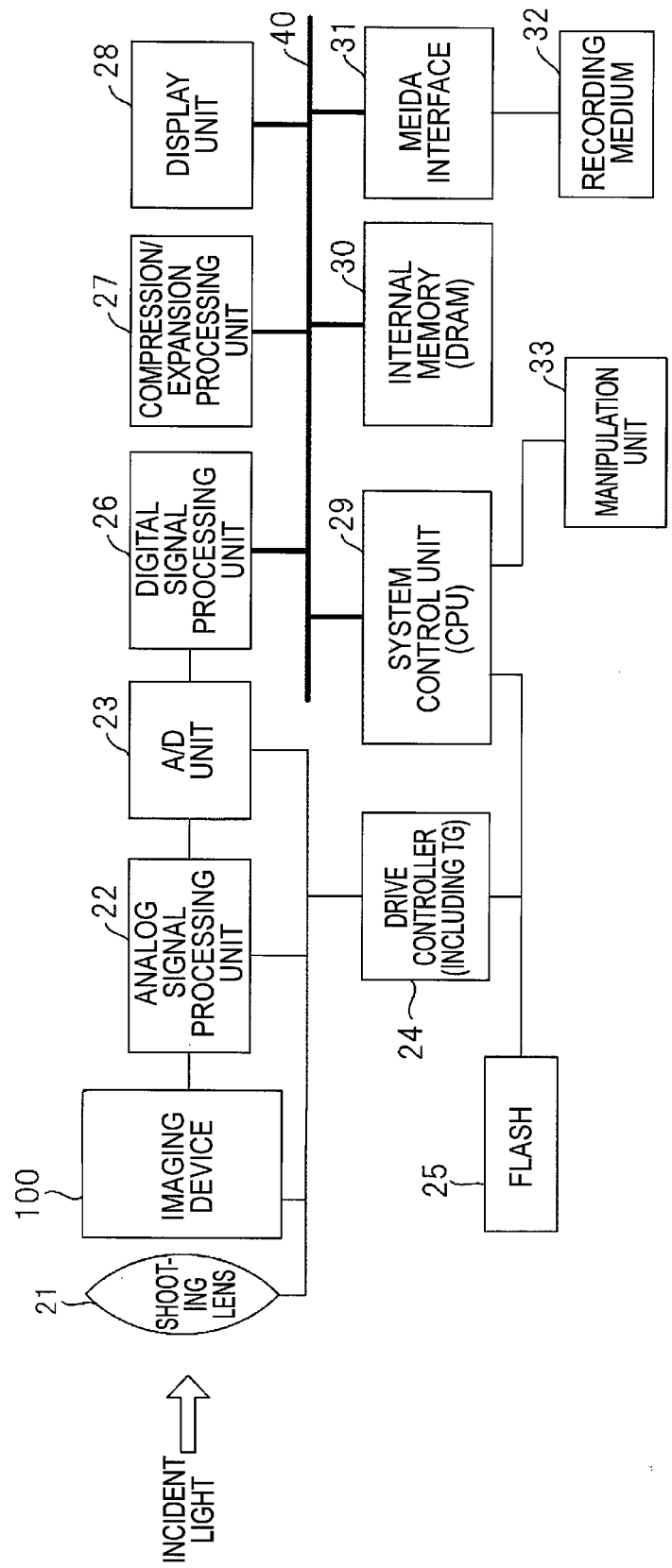
FIG. 1 is a functional block diagram illustrating a digital camera according to an exemplary embodiment of the present invention.

FIG. 1 is a diagram illustrating the configuration of a digital camera (an image pickup apparatus) according to an exemplary embodiment of the present invention. The digital camera includes a solid-state image pickup device 100, a photographing lens 21 disposed in front of the solid-state image pickup device 100, an analog signal processing unit 22 that performs a processing such as automatic gain control (AGC) or correlated double sampling, on an analog image data output from the solid-state image pickup device 100, an analog-to-digital converting (A/D) unit 23 that converts the analog image data output from the analog signal processing unit 22 into digital image data, and a driving controller 24 (including a timing generator) that controls driving of the photographing lens 21, the A/D unit 23, the analog signal processing unit 22 and the solid-state image pickup device 100 in accordance with an instruction issued from a system control unit (CPU) 29 to be described below, and a flash 25 that emits light in accordance with the instruction issued from the CPU 29.

The digital camera also includes a digital signal processing unit 26 that obtains digital image data output from the A/D unit 23 to perform an interpolation processing, a white balance correction processing, or RGB-YC conversion processing, a compression and extension unit 27 that compresses the image data into an image data of JPEG format and extends the compressed image data, a display unit 28 that displays a menu, a through-image or a picked up image, a CPU 29 that comprehensively manages and controls an entirety of the digital camera, an internal memory 30 such as a frame memory, a media interface (I/F) unit 31 that interfaces with a recording medium 32 storing an image data of JPEG format, a bus 40 that interconnects those constitutional elements, and a manipulation unit 33 that is connected to the CPU 29 and used for inputting an instruction from a user.

Figure 2:
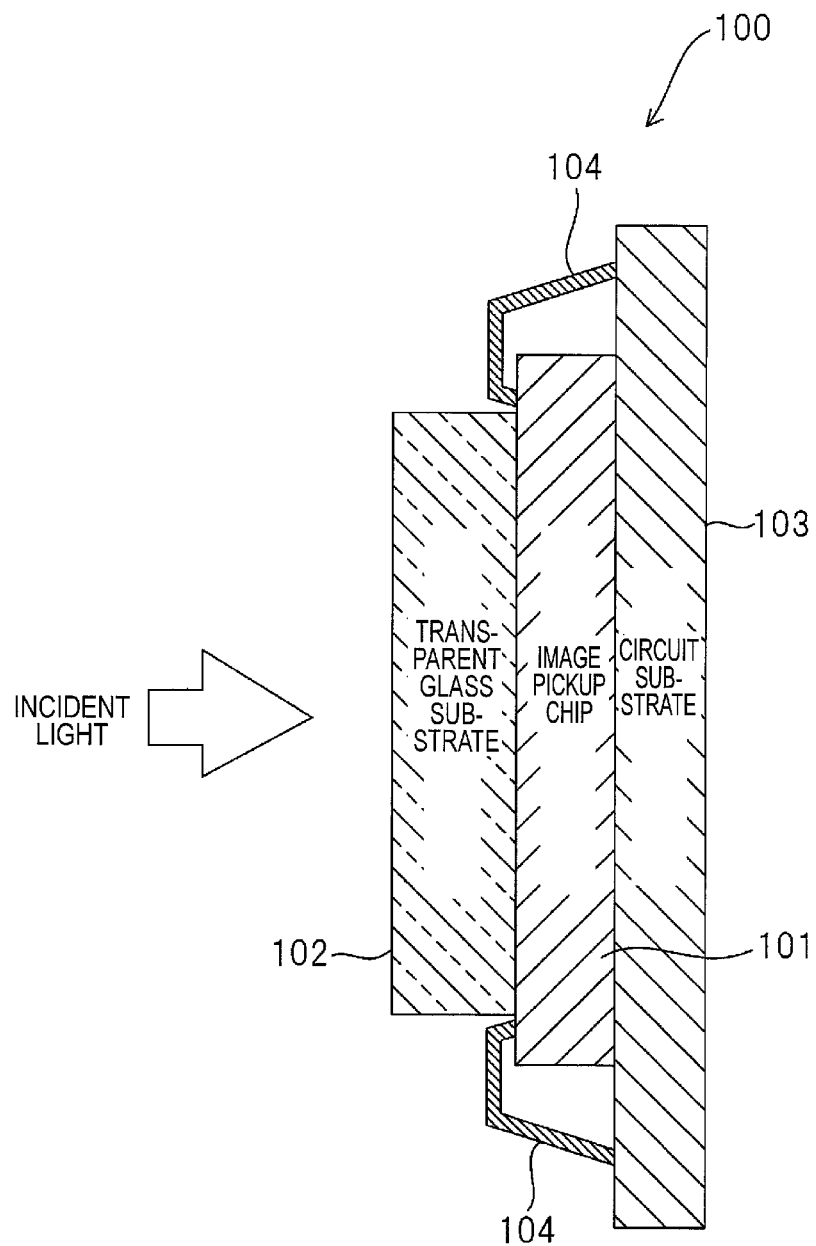
FIG. 2 is a schematic diagram illustrating a longitudinal cross-section of a solid-state image pickup device of FIG. 1.

FIG. 2 is a schematic diagram illustrating a longitudinal cross-section of the solid-state image pickup device 100 shown in FIG. 1. The solid-state image pickup device 100 includes an image pickup device chip 101, a transparent glass substrate 102 bonded to a front surface of a light receiving surface of an imaging area of the image pickup device chip 101 with transparent resin, and a circuit substrate 103 bonded to a rear surface of the image pickup device chip 101.

The area of the circuit substrate 103 is larger than that of the image pickup device chip 101 which is larger than that of the transparent glass substrate 102. The image pickup device chip 101 and the transparent glass substrate 102 are bonded to the central portions of the circuit substrate 103 and the image pickup chip 101, respectively. A plurality of connection pads are formed in the peripheral portion of the image pickup device chip 101, that is, the peripheral portion of the imaging area, and the connection pads are bonded to the circuit substrate 103 by wires 104.

Figure 3:
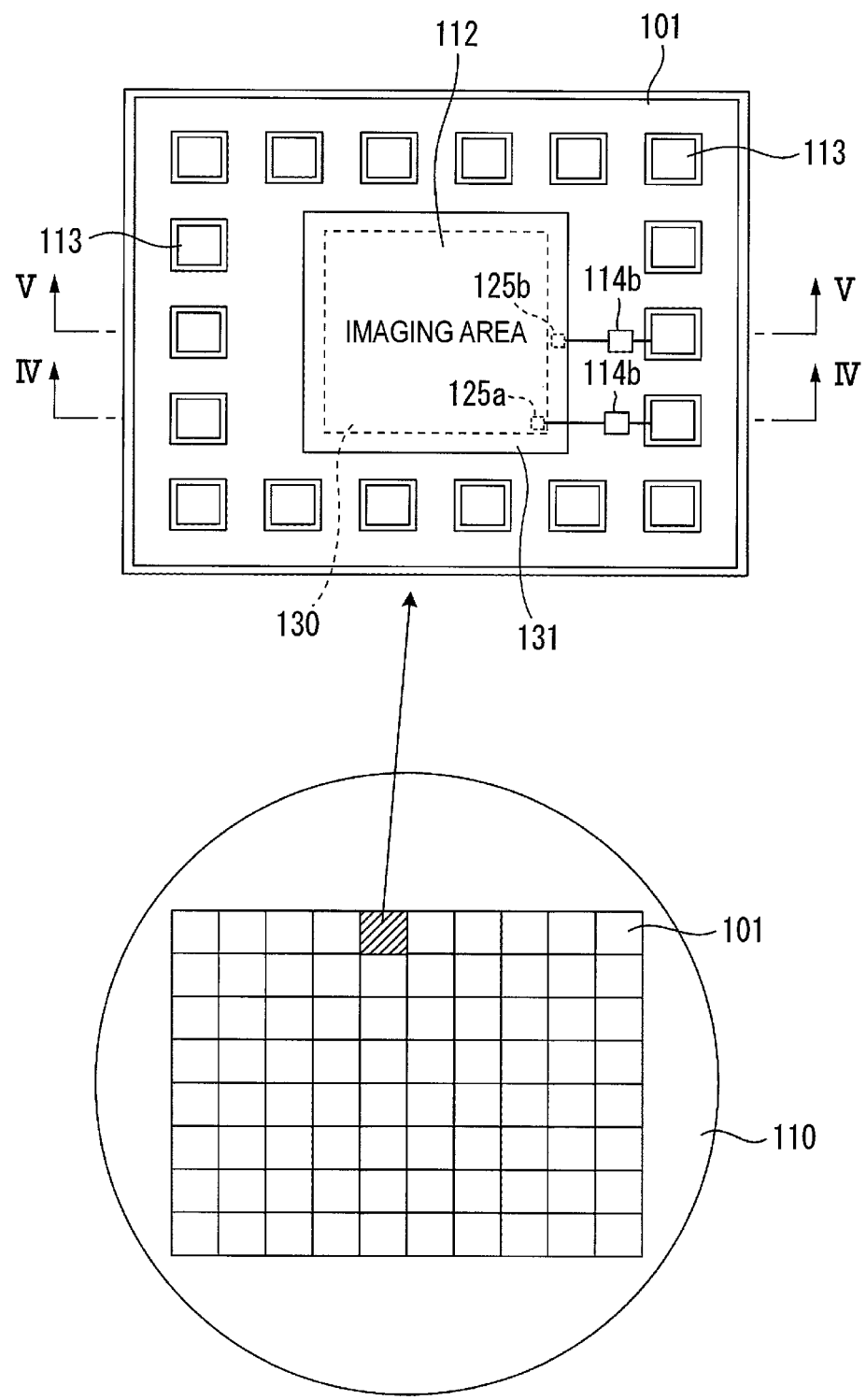
FIG. 3 is an explanatory view illustrating a manufacturing process of the solid-state image pickup device of FIG. 2

FIG. 3 is an explanatory view illustrating a manufacturing process of the image pickup device chip 101. A plurality of the image pickup device chips 101 are formed on a semiconductor wafer 110 using a semiconductor apparatus manufacturing technique or a film manufacturing technique thereof, and each individual image pickup device chips 101 is diced and separated into an individual piece, as will be described below.

The individual image pickup device chip 101 is formed in a rectangular shape, in which the rectangular shaped imaging area 112 are firmed at the central portion of the image of the image pickup device chip and a connection pad 113 are formed at the peripheral portion of the image pickup device chip. The test terminals 114a, 114b for testing are provided between an inner side (e.g., imaging area 112 side) of the connection pad 113 and the outside of the imaging area 112. The constitutional elements denoted by the reference numerals 125a, 125b, 130 and 131 will be described below with reference to FIGS. 4 and 5.

The transparent glass substrate 102 is bonded on the light receiving surface of an imaging area 112 with transparent resin. In the exemplary embodiment, the transparent glass substrate 102 is bonded only to the image pickup device chip 101 which is determined to be non-defective, as will be described below. The wires 104 shown in FIG. 2 are bonded to the connection pad 113 of the image pickup device chip 101 which is determined to be non-defective.

Figure 4:
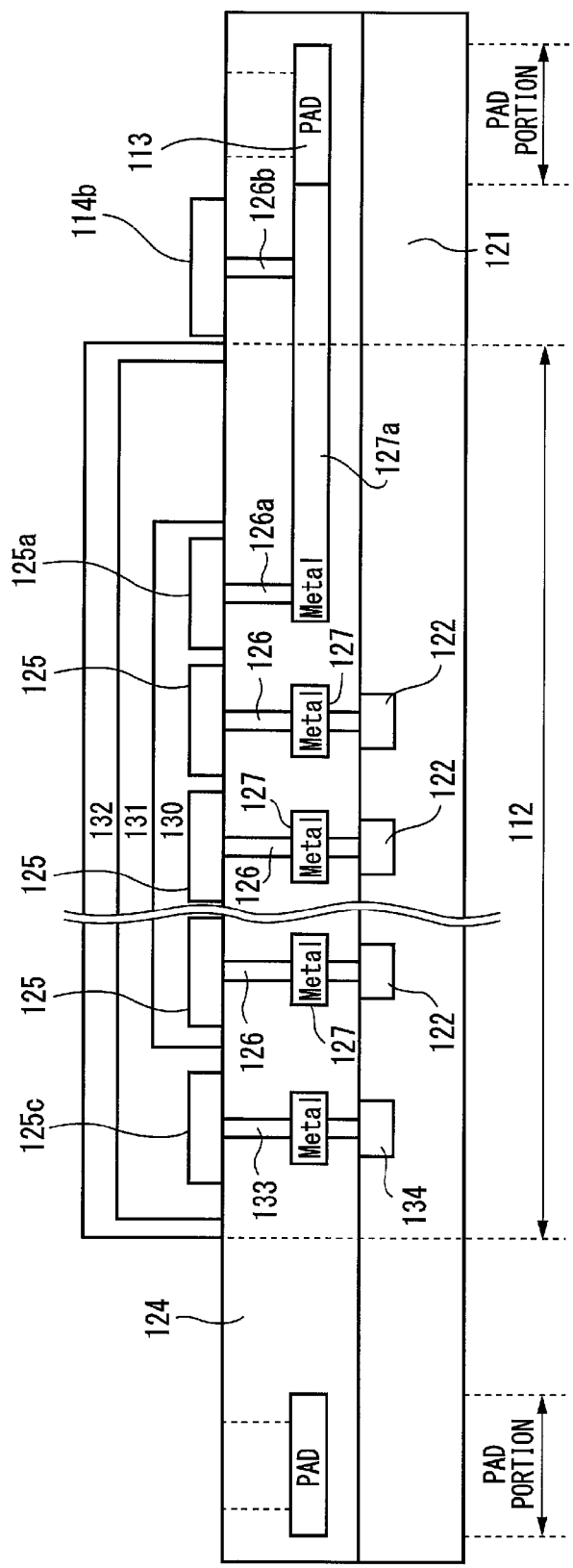
FIG. 4 is a cross-sectional view taken along line IV-IV of FIG. 3.
Figure 5:
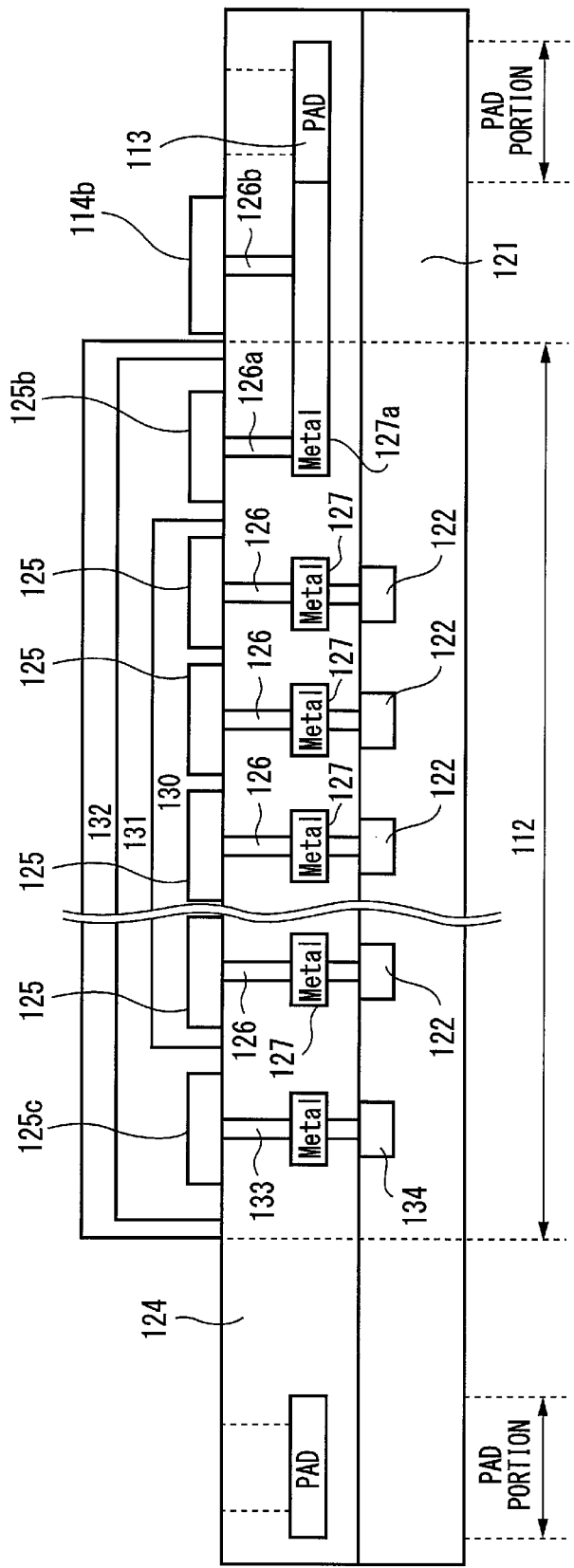
FIG. 5 is a cross-sectional view taken along line V-V of FIG. 3.

FIG. 4 is a schematic diagram illustrating a cross-section taken along line IV-IV (in which the test terminal 114b is provided) of FIG. 3. FIG. 5 is a schematic diagram illustrating a cross-section taken along line V-V (in which the test terminal 114b is provided) of FIG. 3.

The image pickup device chip 101 is formed on the semiconductor substrate 121. In the semiconductor substrate 121, a plurality of signal charge accumulation parts 122 each corresponding to each pixel, and a plurality of signal reading-out circuits each constituted with a MOS transistor circuit (not shown) corresponding to each pixel are also formed as in a CMOS type image sensor.

Each signal read-out circuit read-outs a signal corresponding to signal charges accumulated at the corresponding signal accumulation part 122 as an imaging signal via the corresponding connection pad 113. The signal read-out circuit may be a CCD type.

An insulation film 124 is laminated on the top surface of the semiconductor substrate 121, and the pixel electrode films 125 corresponding to individual pixels and formed on the insulation film 124 are arranged in a two dimensional array in the imaging area 112. The pixel electrode films 125 are made of a conductive material such as, for example, aluminium or Indium Tin Oxide (ITO).

In the same plane as the pixel electrode films 125 outside of an area where all of the pixel electrode films 125 are disposed in the imaging area 112, a pixel electrode film 125a made of the same material of the pixel electrode films 125, a test electrode film 125b made of the same material of the pixel electrode films 125 and connected to an opposing electrode 131 and, a bias voltage application electrode film 125c made of the same material of the pixel electrode films 125 for applying a bias voltage to the opposing electrode 131 are formed.

Further, in the same plane as the pixel electrode films 125 outside of the imaging area 112, the test terminals 114a, 114b made of the same material of the pixel electrode films 125 are formed. The test terminals 114a, 114b are formed in the same manufacturing process as the pixel electrode films 125.

Therefore, a height of an end portion surface of the semiconductor substrate 121 side of the pixel electrode films 125 from the surface of the semiconductor substrate 121 is equal to a height of end portion surface of the semiconductor substrate 121 side of the test electrode film 125a and the test terminals 114a, 114b from the surface of the semiconductor substrate 121, and the thickness (the thickness in the direction perpendicular to the surface of the semiconductor substrate 121) of the pixel electrode films 125 is equal to those of the test electrode film 125a and the test terminals 114a, 114b.

Each of the pixel electrode films 125 is connected to each of the signal accumulation parts 122 corresponding to the pixel through via plug 126 erected and buried in the insulation film 124.

The metal films 127 which are individually separated are buried in the insulation film 124 at a middle the via plug 126, and intended to shield the signal accumulation parts 122 from light.

After the lower half of the insulation film 124 is laminated, the metal film 127 is formed thereon, and the upper half of the insulation film 124 is laminated on each metal film 127 which is formed on the lower half thereof.

The pixel electrode film 125a is connected to a metal wiring layer 127a formed within the insulation film 124 through the via plug 126.

The metal wiring layer 127a extends to the connection pad 113 provided within the insulation film 124 outside of the imaging area 112 to be connected to the connection pad 113.

The test terminal 114a is connected to the metal wiring layer 127a through the via plug 126b formed below the test terminal 114a. That is, the test terminal 114a is electrically connected to the pixel electrode film 125a through the metal wiring layer 127a and the via plugs 126a, 126b.

The test electrode film 125b is connected to the metal wiring layer 127a formed within the insulation film 124 through the via plug 126a.

The metal wiring layer 127a extends to the connection pad 113 provided within the insulation film 124 outside of the imaging area 112 to be connected to the connection pad 113.

The test terminal 114b is connected to the metal wiring layer 127a through the via plug 126b formed below the test terminal. That is, the test terminal 114b is electrically connected to the test electrode film 125b through the metal wiring layer 127a and the via plugs 126a, 126b.

The metal wiring layer 127a is formed with the same manufacturing process as that for the each metal film 127. Further, when via plug 126 is formed, the via plugs 126a, 126b are simultaneously formed with the same manufacturing process.

Single light receiving layer 130 shared by each of the pixel electrode films 125 and 125a is formed on the respective pixel electrode films 125 and 125a.

Figure 6:
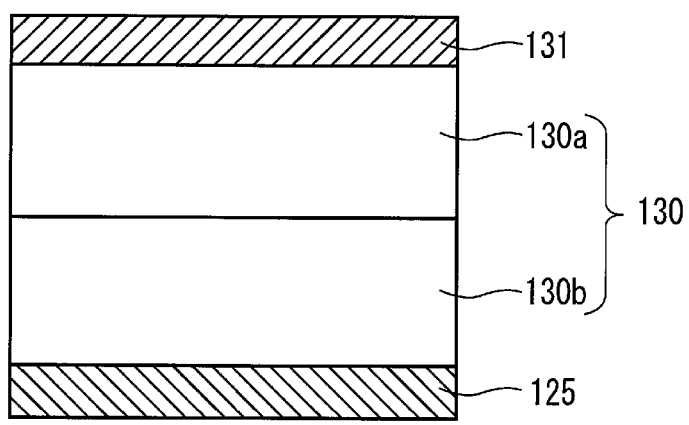
FIG. 6 is a cross-sectional view of a light receiving layer of FIG. 3.

The light receiving layer 130 is constituted with a photoelectric conversion layer (photoelectric conversion film) 130a and a charge blocking layer 130b formed below (e.g., the semiconductor substrate side) thereof, as shown in cross section thereof of FIG. 6 in the exemplary embodiment.

An organic film generating charges corresponding to an amount of the incident light is used as the photoelectric conversion layer 130a in the exemplary embodiment. The thickness of the organic film (the photoelectric conversion layer) 130a is approximately 1.0 μm, and more preferably, 0.4 μm to 0.7 μm.

Hereinafter, an exemplary configuration of the light receiving layer 130 will be described.

The charge blocking layer 130b has a function of suppressing a dark current, and may be constituted with a plurality of layers. The interfaces are formed between the plurality of charge blocking layers and discontinuities are generated in the intermediate electrical potentials existed in the respective charge blocking layers due to the formation of the charge blocking layer 130b with a plurality of layers, making the charge carrier difficult to move. As a result, the dark current can be strongly suppressed.

The photoelectric conversion layer 130a includes a p-type organic semiconductor and an n-type organic semiconductor. Forming a donor-acceptor interface by joining the p-type organic semiconductor and the n-type organic semiconductor can increase the exciton dissociation efficiency. Therefore, a photoelectric conversion layer 130a in which the p-type organic semiconductor and the n-type organic semiconductor are joined to each other exhibits high photoelectric conversion efficiency. In particular, a photoelectric conversion layer 130a in which the p-type organic semiconductor and the n-type organic semiconductor are mixed with each other is preferable because an increased junction interface area increases the photoelectric conversion efficiency.

The p-type organic semiconductor (compound) is an acceptor-type organic semiconductor and is an organic compound which tends to accept electrons as typified by a hole-transporting organic compound. More specifically, the p-type organic semiconductor is an organic compound having a lower ionization potential of two organic compounds when they are used being in contact with each other. Therefore, any electron-accepting organic compound can be used as an acceptor-type organic semiconductor.

Usable examples are triarylamine compounds, benzidine compounds, pyrazoline compounds, stytrylamine compounds, hydrazone compound, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand.

As described above, other organic compounds can also be used as an acceptor-type organic semiconductor as long as they have a lower ionization potential than an organic compound used as an n-type (donor-type) compound.

The n-type organic semiconductor (compound) is a donor-type organic semiconductor and is an organic compound which tends to donate electrons as typified by an electron-transporting organic compound. More specifically, the n-type organic semiconductor is an organic compound having higher electron affinity of two organic compounds when they are used being in contact with each other. Therefore, any electron-donating organic compound can be used as a donor-type organic semiconductor.

Usable examples are condensed aromatic carbocyclic compounds (naphthalene derivatives, anthracene derivatives, phenanthrene derivatives, tetracene derivatives, pyrene derivatives, perylene derivatives, and fluoranthene derivatives), 3- to 5-membered heterocyclic compounds containing a nitrogen atom(s), an oxygen atom(s), and/or a sulfur atom(s) (e.g., pyridine, pyrazine, pyrimidine, pydazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotrizole, benzoxazole, benzothiazole, carbazole, purine, triazolopyridazine, triazolopyrimizine, tetrazainedene, oxadiazole, imidazopyridine, pyralizine, pyrrolopyridine, thiadiazolopyridine, dibenzazepine, and tribenzazepine), polyarylene compounds, fluorene compounds, cyclopentadien compounds, silyl compounds, and metal complexes having a nitrogen-containing heterocyclic compound as a ligand.

As described above, other organic compounds can also be used as a donor-type organic semiconductor as long as they have higher electron affinity than an organic compound used as a p-type (acceptor-type) compound.

Although any organic dyes can be used as a p-type or n-type organic semiconductor, preferable examples are a cyanine dye, a styryl dye, a hemicyanine dye, a merocyanine dye, (including a zero-methine merocyanine dye (simple merocyanine dye), a 3-nucleus merocyanine dye, a 4-nucleus merocyanine dye, a rhodacyanine dye, a complex cyanine dye, a complex merocyanine dye, an allopolar dye, an oxonol dye, a hemioxonol dye, a squarium dye, a croconium dye, an azamethine dye, a coumarin dye, an arylidene dye, an anthraquinone dye, a triphenylmethane dye, an azo dye, an azomethine dye, a Spiro dye, a metallocene dye, a fluorenone dye, a flugido dye, a perylene dye, a perinone dye, a phenazine dye, a phenothiazine dye, a quinone dye, diphenylmethane dye, a polyene dye, an acridine dye, an acridinone dye, a diphenylamine dye, a quinacridone dye, a quinophtharone dye, a phenoxazine dye, a phthaloperylene dye, a diketopyrrolopyrrole dye, a dioxane dye, a porphyrin dye, a chlorophyll dye, phthalocyanine dye, metal complex dyes, and condensed aromatic carbocyclic dyes (naphthalene derivatives, anthracene derivatives, phenanthrene derivatives, tetracene derivatives, pyrene derivatives, perylene derivatives, and fluoranthene derivatives).

It is particularly preferable to use, as an n-type organic semiconductor, fullerene or a fullerene derivative which is superior in electron transportability. Fullerene includes fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$ mixed fullerene, and fullerene nanotube. Usable fullerene derivatives are compounds that are the above various types of fullerene having a substituent group.

Where the photoelectric conversion layer 130a contains fullerene or a fullerene derivative, electrons generated through photoelectric conversion can be transported fast to the pixel electrode films 125 or the counter electrode film 131 via fullerene molecules or fullerene derivative molecules. If an electron path is formed by a succession of fullerene molecules or fullerene derivative molecules, the electron transportability is increased, whereby the solid-state imaging device 100 can exhibit a high response speed. It is therefore preferable that the photoelectric conversion layer 130a contain fullerene or a fullerene derivative at a proportion of 40% or more. However, if fullerene or a fullerene derivative is contained too much, the proportion of p-type organic semiconductor becomes too small and hence the junction interface area becomes too small, as a result of which the exciton dissociation efficiency is lowered.

It is particularly preferable to use, as a p-type organic semiconductor to be used together with fullerene or a fullerene derivative in mixture to form the photoelectric conversion layer 130a, a triarylamine compound as described in Japanese Patent No. 4,213,832 etc., because it allows the solid-state imaging device 100 to exhibit a large S/N ratio. If the photoelectric conversion layer 130a contains fullerene or a fullerene derivative too much, the proportion of the triarylamine compound becomes small, as a result of which the absorptance of incident light is lowered and hence the photoelectric conversion efficiency is lowered. It is therefore preferable that the photoelectric conversion layer 130a contain fullerene or a fullerene derivative at a proportion of 85% or less.

An electron-donating organic material can be used to form the charge blocking film 130b. Example low-molecular-weight materials are aromatic diamine compounds such as N,N'-bis (3-methylphenyl)-(1,1'-biphenyl)-4,4'-diamine (TPD) and 4,4'-bis[N-(naphthyl)-N-phenyl-amino]biphenyl (α-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphine, tetraphenylporphine copper, phthalocyanine, copper phthalocyanine, polyphyline compounds such as titanium phthalocyanine oxide, triazole derivatives, oxadiazole derivatives, imidazole derivatives, polyarylalkane derivatives, pyrazolone derivatives, phenylenediamine derivatives, anylamine derivatives, amino-substituted chalcone derivatives, oxazole derivatives, styrylanthracene derivatives, fluorenone derivatives, hydrazone derivatives, and silazane derivatives. Example high-molecular-weight materials are polymers such as phenylenevinylene, fluorene, carbazole, indole, pyrene, pyrrole, picoline, thiophene, acetylene, and diacetylene, and derivatives thereof. A compound having a sufficient hole-transporting ability can be used even if it is not an electron-donating compound.

An inorganic material can also be used to form the charge blocking film 130b. In general, inorganic materials are higher in permittivity than organic materials. Therefore, where the charge blocking film 130b is made of an inorganic material, a higher voltage develops across the photoelectric conversion layer 130a, whereby the photoelectric conversion efficiency can be increased.

Example materials of the charge blocking film 130b are calcium oxide, chromium oxide, chromium copper oxide, manganese oxide, cobalt oxide, nickel oxide, copper oxide, gallium copper oxide, strontium copper oxide, niobium oxide, molybdenum oxide, indium copper oxide, indium silver oxide, and iridium oxide.

Where the charge blocking film 130b consists of plural films, it is preferable that the film that is adjacent to the photoelectric conversion layer 130a be made of the same material as the p-type organic semiconductor contained in the photoelectric conversion layer 130a. Using, in the charge blocking film 130b, the same p-type organic semiconductor as used in the photoelectric conversion layer 130a makes it possible to suppress the dark current further by preventing formation of intermediate energy states at the interface of the film that is adjacent to the photoelectric conversion layer 130a.

Where the charge blocking film 130b is a single film, it may be made of an inorganic material. Where the charge blocking film 130b consists of plural films, one or more films may be made of an inorganic material.

Referring back to FIGS. 4 and 5, the transparent opposing electrode film 131 such as ITO film which is configured by a single film being shared by all of the pixels, is laminated on the light receiving layer 130.

The transparent opposing electrode film 131 is formed to cover the light receiving layer 130, the bias voltage application electrode film 125c and the test electrode film 125b, and electrically connected with the bias voltage application electrode film 125c and test electrode film 125b. The bias voltage application electrode film 125c and the test electrode film 125b are formed at an outer circumferential area of the light receiving layer 130.

In the solid-state image pickup device, a photoelectric conversion unit for obtaining an imaging signal is formed to include the pixel electrode film 125, the opposing electrode film 131 formed above the pixel electrode film 125 and the light receiving layer 130 formed between the pixel electrode film 125 and the opposing electrode film 131. A test photoelectric conversion unit for testing the light receiving layer 130 is formed to include the pixel electrode film 125a, the opposing electrode film 131 formed above the pixel electrode film 125a and the light receiving layer 130 formed between the pixel electrode film 125a and the opposing electrode film 131.

The electrode film for a bias voltage application 125c is connected to a heavily doped layer 134 of the semiconductor substrate 121 through a via plug 133. The required voltage is applied to the opposing electrode film 131 through the heavily doped layer 134, a wiring layer (not shown) and the corresponding connection pad 113 from outside.

The transparent protective film 132 covers the opposing electrode film 131. In the solid-state image pickup device for picking up color image, for example, laminating color filter layers of three RGB primary colors in Bayer array are stacked on the transparent protective film 132 (or a planarized film) and the transparent protective film is stacked on the laminating color filter layers.

As described above, the image pickup device chip 101 as illustrated in FIG. 1 has a configuration which includes a plurality of the photoelectric conversion units for obtaining the imaging signal arranged in a two-dimensional array and the test photoelectric conversion unit, and in which the test terminal 114a electrically connected to the pixel electrode film 125a of the test photoelectric conversion part and the test terminal 114b electrically connected to the opposing electrode film 131 of the test photoelectric conversion unit are provided outside of the imaging area 112.

With this configuration, light is irradiated to the solid-state image pickup device 100 while a predetermined bias voltage is being applied to the test terminal 114b and a signal corresponding to the generated electrical charges from the light receiving layer 130 of the test photoelectric conversion unit by the irradiated light is read out by the signal read-out circuit connected to the test terminal 114b, such that it is possible to test whether the light receiving layer 130 has a performance conforming to the design requirements without using the connection pad 113.

In addition, it is possible to test the light receiving layer not by simply drawing out a check signal from the test terminal 114b but by using an amplified signal made by amplifying the photo-electrically converted signal as a test signal. In this case, an amplification circuit for amplifying the photo-electrically converted signal is needed, but a power supply terminal for operating the amplification circuit or the like may be also formed on the same plane as the pixel electrode films 125 in the same manufacturing process thereof.

In the image pickup device chip 101, the test terminals 114a, 114b are made of the same material and formed in the same plane as those of the pixel electrode films 125. Therefore, as in the manufacturing method to be described below, the test terminals 114a, 114b can be also made in the same manufacturing process as the pixel electrode films 125.

Accordingly, it is possible to manufacture the image pickup device chip 101 without adding a manufacturing process of forming the test terminals 114a, 114b, thereby reducing manufacturing cost.

In the image pickup device chip 101, since the test electrode film 125b is made of the same material and formed in the same plane as the pixel electrode film 125, as in the manufacturing method to be described below, the test electrode film 125b can be also formed in the same manufacturing process as the pixel electrode film 125.

Accordingly, it is possible to manufacture the image pickup device chip 101 without adding a manufacturing process of forming the test electrode film 125b, thereby reducing manufacturing cost.

In particular, when manufacturing a solid-state image pickup device such as image pickup device chip 101 of which the light receiving layer 130 contains an organic material, it is difficult to manufacture a light receiving layer having a high photoelectric conversion efficiency, and required to prevent a performance of the light receiving layer from being degraded during manufacturing the test terminal or the like.

According to the exemplary embodiment described above, since the test terminal or the test electrode film can be made of the same material and formed in the same manufacturing process as the pixel electrode film 125 which is an essential constitutional element for a photoelectric conversion film laminated-type solid-state image pickup device, it is possible to manufacture the test terminal or the test electrode film while avoiding the degradation of function of the light receiving layer.

Hereinafter, the manufacturing method of the above-mentioned image pickup device chip 101 will be described.

After forming an inner configuration of the insulation film 124, conductive material is deposited on the insulation film 124 as material of the pixel electrode films 125. Subsequently, the conductive material film formed with depositing is patterned through photolithography and etching to form the pixel electrode films 125, 125a and the test terminal 114b simultaneously.

Subsequently, a mask is prepared to shield a portion except for an area where the pixel electrode films 125, 125a are formed from light, and single light receiving layer 130 covering the pixel electrode films 125, 125a is formed thereon using the mask.

Subsequently, a mask is prepared to shield a portion except for an area where the opposing electrode film 131 of the imaging area 112 needs to be formed from light, and single opposing electrode film 131 covering the light receiving layer 130, the electrode film for testing 125b and the bias voltage application electrode film 125c is formed thereon.

Subsequently, a protective film 132 covering the opposing electrode film 131 is formed using a mask shield a portion except for the imaging area 112 from light.

Figure 7:
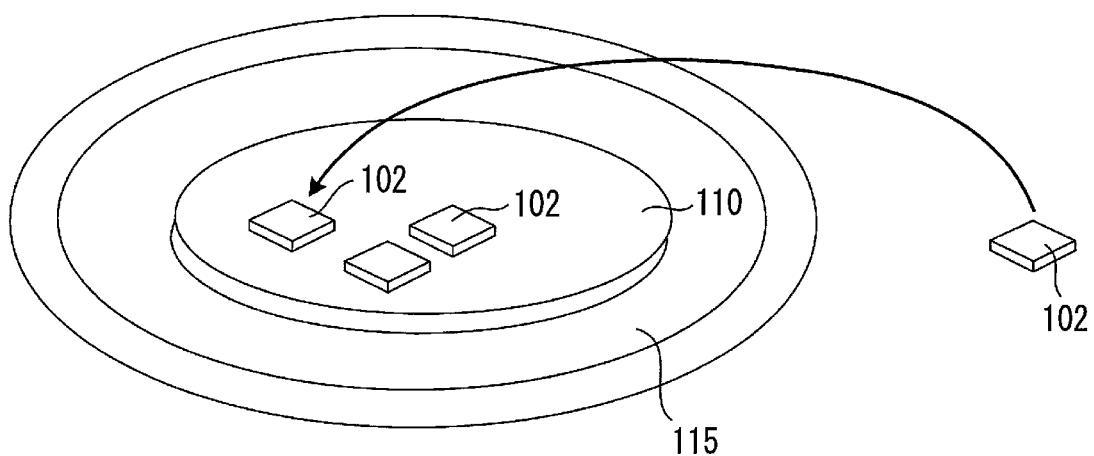
FIG. 7 is an explanatory view illustrating a case where a transparent glass substrate is bonded on a solid-state image pickup device chip which is determined to be non-defective.

Subsequently, a test process for the light receiving layer 130 is performed. In the test process, as illustrated in lower part of FIG. 3, a plurality of the image pickup device chips 101 are manufactured to be placed on the semiconductor wafer 110, and then, as illustrated in FIG. 7, the semiconductor wafer 110 is disposed on a support substrate (circuit substrate) 115. Subsequently, a property evaluation for each image pickup device chip 101 is performed with the test terminals 114a, 114b to determine whether the image pickup device chip 101 is defective or non-defective.

Figure 8:
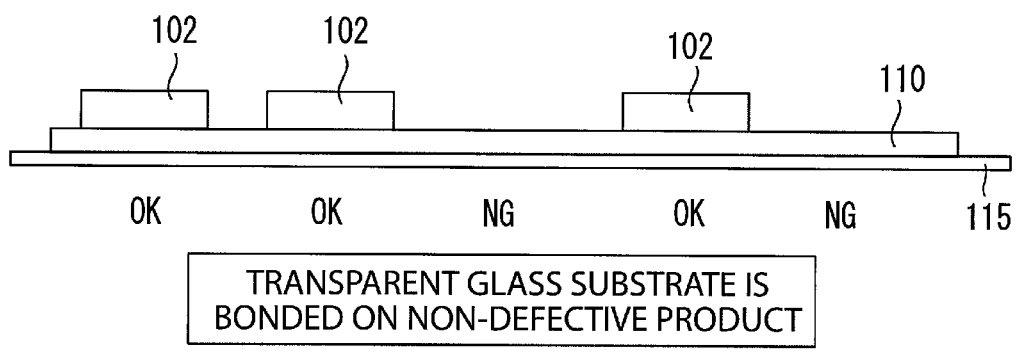
FIG. 8 is a cross-sectional view of a structure shown in FIG. 7.

The transparent glass substrate 102 is bonded on the imaging area 112 of the image pickup device chip 101, which is evaluated to be non-defective from the property evaluation, with transparent resin. The transparent glass substrate 102 is, as illustrated in FIG. 8, is not bonded on a defective product (NG device) and the remaining manufacturing processes for the defective product are stopped. Accordingly, it is not necessary to uselessly bond the transparent glass substrate 102 to the image pickup device chip 101 which is determined to be defective.

Subsequently, a connection pad 113 of the image pickup device chip 101 which is non-defective is exposed to perform wire bonding between the connection pad 113 and the lower support substrate (circuit substrate) 115, and dicing to be individualized in individual solid-state image pickup device 100.

Therefore, it is possible to improve manufacturing throughput of the non-defective image pickup device 100 and reduce the manufacturing costs of the image pickup device 100.

Further, according to the method described above, it is possible to form the pixel electrode films 125, 125a, the test terminals 114a, 114b and the test electrode film 125b with the same manufacturing process, the reduction of manufacturing costs can be achieved.

Still further, after forming the test terminals 114a, 114b, the light receiving layer 130, the opposing electrode 131 and the protective film 132 can be formed while the test terminals 114a, 114 are being masked. Therefore, it is possible to prevent the test terminals 114a, 114 and the test accuracy from being degraded.

In the embodiment illustrated in FIGS. 3 to 5, the test electrode films 125a, 125b are formed at a position in the lower part of the periphery of the light receiving layer 130 and a position in the lower part of the periphery of the opposing electrode film 131 within the imaging area 112, respectively, but those positions are not limited thereto.

Figure 9:
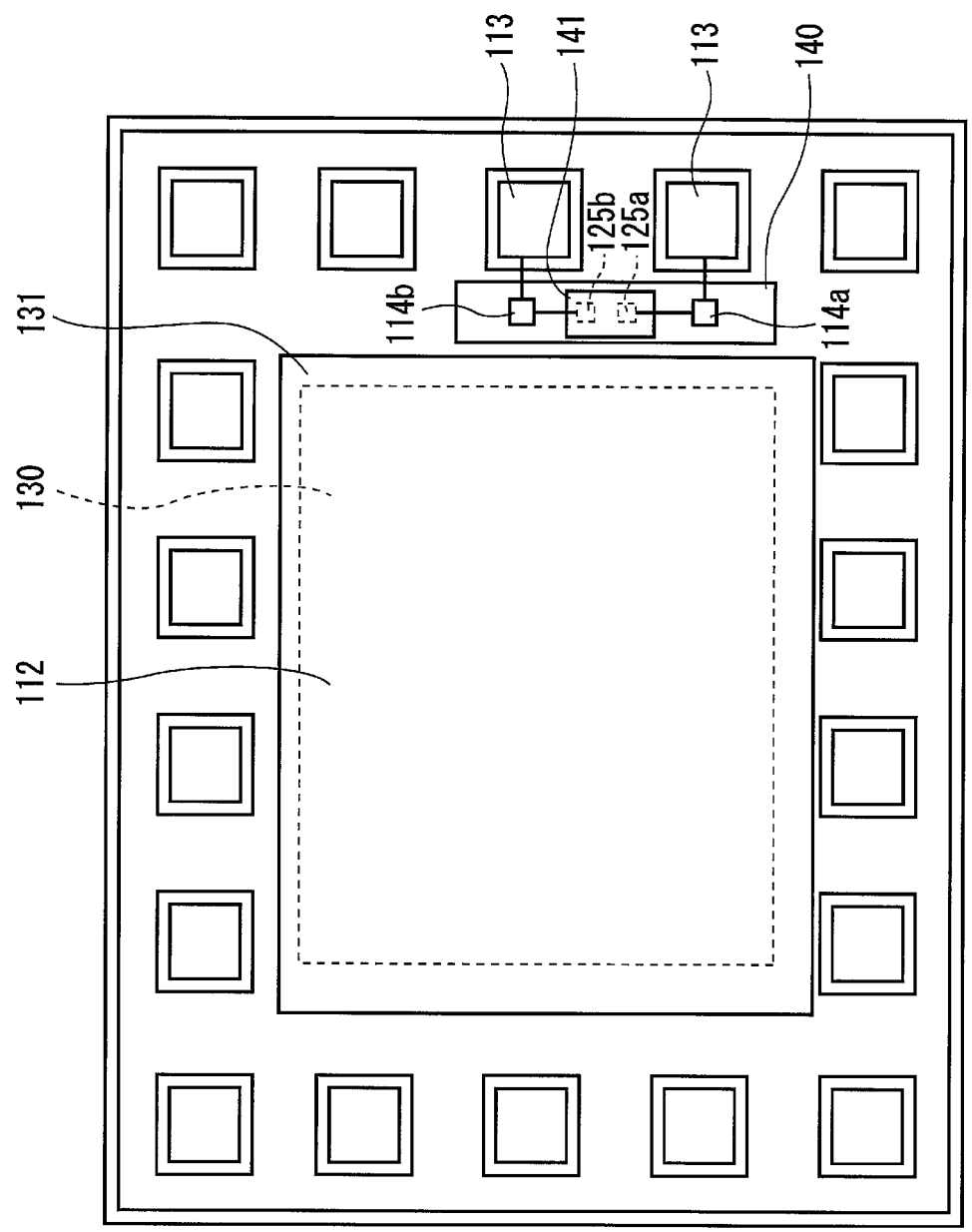
FIG. 9 is an explanatory view illustrating a position where a test pad is formed according to another embodiment of the present invention.

For instance, as shown in FIG. 9, an area 140 adjacent to the imaging area 112 as an area other than the imaging area 112 is prepared, and the test terminals 114a, 114b are formed at the area 140. Further, the pixel electrode film 125a and the test electrode film 125b are formed on an area 141 sandwiched between the test terminals 114a, 114b, and the same material as the light receiving layer 130 is laminated only on the pixel electrode film 125a with the same manufacturing process as the light receiving layer 130. In addition, the same material as the opposing electrode film 131 is laminated on the pixel electrode films 125a, 125b with the same manufacturing process as the opposing electrode film 131.

With the configuration illustrated in FIG. 9, the determination as to whether the light receiving layer 130 in the imaging area 112 is defective or non-defective can be made by the determination as to whether the light receiving layer 130 in the test area 141 is defective or non-defective.

As described above, the following matters are disclosed in the specification.

The solid-state image pickup device as described above includes a plurality of photoelectric conversion units arranged in a two-dimensional array on an upper surface of a semiconductor substrate. Each of the plurality of photoelectric conversion units include a pixel electrode film, an opposing electrode film opposing the pixel electrode film and a light receiving layer sandwiched between the pixel electrode film and the opposing electrode film. The solid-state image pickup device includes a plurality of signal read-out circuits each configured to read out a signal corresponding to an amount of electrical charges generated in the light receiving layer and transferred to the pixel electrode film, and a plurality of test terminal disposed outside of an area where the photoelectric conversion units are disposed to test the photoelectric conversion units. The test terminals are disposed on the same surface and made of the same material as the pixel electrode film.

In the solid-state image pickup device as described above, the photoelectric conversion units arranged in a two-dimensional array include a plurality of photoelectric conversion units for obtaining an imaging signal and a test photoelectric conversion unit disposed outside of an area where the plurality of photoelectric conversion units for obtaining an imaging signal are disposed. The test terminals are constituted with a first test terminal electrically connected to the pixel electrode film of the test photoelectric conversion unit and a second test terminal electrically connected to the opposing electrode film of the test photoelectric conversion unit.

In the solid-state image pickup device as described above, the light receiving layer and the opposing electrode film are constituted as a single layer shared by all of the photoelectric conversion units arranged in a two-dimensional array. And the pixel electrode film, the light receiving layer and the opposing electrode film are formed in this order from the semiconductor substrate side. The solid-state image pickup device further includes a test electrode film disposed outside of an area where all of the photoelectric conversion units are disposed, and the test electrode film is disposed on the same plane and made of the same material as the pixel electrode film. The opposing electrode film is formed to cover the test electrode film, and the pixel electrode film of the test photoelectric conversion unit and the first test terminal are connected with each other by wiring so that the test electrode film and the second test terminal are connected with each other by wiring.

The light receiving layer of the solid-state image pickup device is configured to contain organic material.

A manufacturing method of the solid-state image pickup device as described above, in which the photoelectric conversion units of the solid-state image pickup device each including a pixel electrode film, an opposing electrode film opposing the pixel electrode film, a light receiving layer sandwiched between the pixel electrode film and the opposing electrode are arranged in a two-dimensional array on an upper surface of a semiconductor substrate, includes depositing and patterning a conductive material on the upper surface of the semiconductor substrate in which a signal read-out circuit reading out a signal corresponding to amounts of electrical charges generated in the light receiving layer and transferred to the pixel electrode film is formed; and forming both the pixel electrode film and the test terminal simultaneously for testing the photoelectric conversion units.

In the manufacturing method of the solid-state image pickup device as described above, the photoelectric conversion units arranged in a two-dimensional array include a plurality of photoelectric conversion units for obtaining an imaging signal and a test photoelectric conversion unit disposed outside of an area where the plurality of photoelectric conversion units for obtaining an imaging signal are disposed. The simultaneously forming both the pixel electrode film and the test terminals further includes forming, as the test terminals, a first test terminal electrically connected to the pixel electrode film of the test photoelectric conversion unit and a second test terminal electrically connected to the opposing electrode film of the test photoelectric conversion unit.

The simultaneously forming both the pixel electrode film and the test terminal of the manufacturing method of the solid-state image pickup device, includes simultaneously forming a test electrode film disposed outside of an area where all of photoelectric conversion units are arranged in a two-dimensional array, the pixel electrode films of all of the photoelectric conversion units and the test terminals; forming a light receiving layer on the pixel electrode films after forming the test electrode film, the pixel electrode films and the test terminals; forming an opposing electrode film on the light receiving layer and the test electrode film; forming a wiring layer connecting the pixel electrode film of the test photoelectric conversion units and the first test terminal; and forming another wiring layer connecting the test electrode film and the test second terminal.

In the manufacturing method of the solid-state image pickup device, the light receiving layer is configured to contain organic material.

In the manufacturing method of the solid-state image pickup device, when the light receiving layer is determined to be defective by performing a functional testing of the light receiving layer using the test terminal during manufacturing, the remaining manufacturing processes are stopped The image pickup apparatus as described above includes the solid-state image pickup device.

INDUSTRIAL APPLICABILITY

According to the present invention, it is possible to provide a solid-state image pickup device having a structure capable of being tested even during manufacturing without requiring a separate manufacturing process for the test terminals, a manufacturing method for the solid-state image pickup device, and an image pickup apparatus with the solid-state image pickup device mounted thereon.

Although the present invention has been described in detail and with reference to specific aspects, it will be apparent to a person having an ordinary skill in the art that various altercations and modifications can be made without departing from a scope and spirit of the present invention.

This application is based on and claims priority from Japanese Patent Application Nos. 2010-061622 and 2011-003499, filed on Mar. 17, 2010 and Jan. 11, 2011, respectively, with the Japanese Patent Office, the disclosures of which are incorporated herein in their entirety by reference.

EXPLANATION OF REFERENCE NUMERALS AND SYMBOLS

20: Image pickup apparatus (digital camera)
21: Shooting lens
26: Digital signal processing section
29: System control section
100: Photoelectric conversion layer stack-type solid-state imaging device
101: Image pickup device chip
102: Transparent glass substrate
103: Circuit substrate
104: Wire
110: Semiconductor wafer
112: Imaging area
113: Connection pad
114a, 114b: Test terminals
121: Semiconductor substrate
125: Pixel electrode films
125a, 125b: Test electrode films
126: Via plug
126a: Via plug for test electrode film
126b: Via plug for test terminal
130: Light receiving layer
130a: Photoelectric conversion layer (organic layer)
130b: Charge blocking layer
131: Opposing electrode film
132: Protective film

The invention claimed is:
1. A solid-state image pickup device comprising:
a plurality of photoelectric conversion units each including a pixel electrode film, an opposing electrode film opposing the pixel electrode film and a light receiving layer disposed between the pixel electrode film and the opposing electrode film, the photoelectric conversion units being arranged in a two-dimensional array above a semiconductor substrate includes:
a plurality of signal read-out circuits each configured to read out a signal corresponding to an amount of electrical charges generated in the light receiving layer and transferred to the pixel electrode film; and
a test terminal, for testing the photoelectric conversion units, disposed outside of an area where the photoelectric conversion units are disposed, disposed on the same plane as the pixel electrode film, and made of the same material as the pixel electrode film.

2. The solid-state image pickup device of claim 1, wherein the photoelectric conversion units arranged in the two-dimensional array include a plurality of photoelectric conversion units for obtaining an imaging signal and a test photoelectric conversion unit disposed outside of an area where the plurality of photoelectric conversion units for obtaining an imaging signal are disposed, and the test terminals are constituted with a first test terminal electrically connected to the pixel electrode film of the test photoelectric conversion unit and a second test terminal electrically connected to the opposing electrode film of the test photoelectric conversion unit.

3. The solid-state image pickup device of claim 2, wherein each of the light receiving layer and the opposing electrode film is constituted as a single layered film shared by all of the photoelectric conversion units arranged in the two-dimensional array, the pixel electrode film, the light receiving layer and the opposing electrode film are formed in a following order from the semiconductor substrate side: the pixel electrode film—the light receiving layer—the opposing electrode film, the solid-state image pickup device further includes a test electrode film disposed outside of an area where all of the photoelectric conversion units are disposed, disposed on the same plane as the pixel electrode film, and made of the same material as the pixel electrode film, the opposing electrode film is formed to cover the test electrode film, the pixel electrode film of the test photoelectric conversion unit and the first test terminal are connected with each other by wiring, and the test electrode film and the second test terminal are connected with each other by wiring.

4. The solid-state image pickup device of claim 1, wherein the light receiving layer is configured to contain an organic material.

5. A manufacturing method of a solid-state image pickup device, in which the photoelectric conversion units of the solid-state image pickup device each including a pixel electrode film, an opposing electrode film opposing the pixel electrode film, a light receiving layer disposed between the pixel electrode film and the opposing electrode are arranged in a two-dimensional array above a semiconductor substrate, the method comprising:
forming a film of a conductive material on a smooth surface above the semiconductor substrate in which a plurality of signal read-out circuits each reading out a signal corresponding to amounts of electrical charges generated in the light receiving layer and transferred to the pixel electrode film are formed; and forming both the pixel electrode film and the test terminals for testing the photoelectric conversion units simultaneously by patterning the conductive material on the smooth surface.

6. The manufacturing method of the solid-state image pickup device of claim 5, wherein the photoelectric conversion units arranged in the two-dimensional array include a plurality of photoelectric conversion units for obtaining an imaging signal and a test photoelectric conversion unit disposed outside of an area where the plurality of photoelectric conversion units for obtaining an imaging signal are disposed, and in the firming step of the pixel electrode film and the test terminals for testing the photoelectric conversion units, a first test terminal electrically connected to the pixel electrode film of the test photoelectric conversion unit and a second test terminal electrically connected to the opposing electrode film of the test photoelectric conversion unit are formed as the test terminals.

7. The manufacturing method of the solid-state image pickup device of claim 6, wherein in the firming step of the pixel electrode film and the test terminals for testing the photoelectric conversion units, a test electrode film disposed outside of an area where all of photoelectric conversion units are arranged in the two-dimensional array, the pixel electrode films of all of the photoelectric conversion units, and the test terminals are formed simultaneously, the method further comprising:

forming a light receiving layer above the pixel electrode film after the firming step of the pixel electrode film and the test terminals;

forming the opposing electrode film above the light receiving layer and the test electrode film;

forming a wiring layer connecting the pixel electrode film of the test photoelectric conversion units and the first test terminal; and forming another wiring layer connecting the test electrode film and the second test terminal.

8. The manufacturing method of solid-state image pickup device of claim 5, wherein the light receiving layer is configured to contain an organic material.

9. The manufacturing method of solid-state image pickup device of claim 5, wherein when the light receiving layer is determined to be defective by performing a functional testing of the light receiving layer using the test terminal during manufacturing, the remaining manufacturing processes are stopped.

10. The manufacturing method of solid-state image pickup device of claim 6, wherein when the light receiving layer is determined to be defective by performing a functional testing of the light receiving layer using the test terminal during manufacturing, the remaining manufacturing processes are stopped.

11. The manufacturing method of solid-state image pickup device of claim 7, wherein when the light receiving layer is determined to be defective by performing a functional testing of the light receiving layer using the test terminal during manufacturing, the remaining manufacturing processes are stopped.

12. The manufacturing method of solid-state image pickup device of claim 8, wherein when the light receiving layer is determined to be defective by performing a functional testing of the light receiving layer using the test terminal during manufacturing, the remaining manufacturing processes are stopped.

13. An image pickup apparatus comprising the solid-state image pickup device according to claim 1.

* * * * *